US005349240A

United States Patent [19]

Narita et al.

[11] Patent Number: 5,349,240
[45] Date of Patent: Sep. 20, 1994

[54] SEMICONDUCTOR DEVICE PACKAGE HAVING A SEALING SILICONE GEL WITH SPHERICAL FILLERS

[75] Inventors: Ryoichi Narita, Obu; Yutaka Fukuda, Kariya, both of Japan

[73] Assignee: Nippondenso Co., Ltd., Kariya, Japan

[21] Appl. No.: 965,919

[22] Filed: Oct. 26, 1992

[30] Foreign Application Priority Data

Oct. 30, 1991 [JP] Japan .................. 3-285197

[51] Int. Cl.⁵ .................. H01L 23/28; H01L 23/02
[52] U.S. Cl. .................. 257/791; 257/787; 257/788; 257/789; 257/795
[58] Field of Search .............. 257/787, 788, 789, 791, 257/795

[56] References Cited

U.S. PATENT DOCUMENTS

| | | |
|---|---|---|
| 3,492,157 | 1/1970 | Ito et al. . |
| 3,751,724 | 8/1973 | McGrath . |
| 4,282,136 | 8/1981 | Hunt et al. . |
| 4,337,182 | 6/1982 | Needham . |
| 4,812,897 | 3/1989 | Narita et al. . |
| 4,965,660 | 10/1990 | Ogihara et al. . |
| 5,015,675 | 5/1991 | Walles et al. . |
| 5,225,499 | 7/1993 | Kokaka et al. .................. 257/788 |

FOREIGN PATENT DOCUMENTS

| | | |
|---|---|---|
| 57-212225 | 12/1982 | Japan . |
| 59-149037 | 8/1984 | Japan . |
| 61-76587 | 4/1986 | Japan . |
| 62-96538 | 5/1987 | Japan . |
| 62-240313 | 10/1987 | Japan . |
| 63-15449 | 1/1988 | Japan . |
| 63-183915 | 7/1988 | Japan . |
| 2-324872 | 11/1990 | Japan . |

*Primary Examiner*—Sara W. Crane
*Assistant Examiner*—Carl Whitehead, Jr.
*Attorney, Agent, or Firm*—Cushman, Darby & Cushman

[57] ABSTRACT

A semiconductor element mounted on a board is sealed with a sealing resin, The semiconductor element is electrically bonded to the board through a soldering bump. The sealing resin includes a silicone gel as a base resin and a filler filled into a silicone gel. A diameter of the filler is equal to or shorter than the distance between the semiconductor element and the board, and a shape of the filler is spherical to improve a thermal conductivity of the sealing resin. The relationship between a coefficient $\alpha$ of a linear expansion and a complex modulus of elasticity $G^*$ of the sealing resin is defined as follows to reduce a force pushing up the semiconductor element:

$$\alpha \leq 0.033(G^* - 451)^{-0.56}.$$

7 Claims, 8 Drawing Sheets

SEMICONDUCTOR DEVICE PACKAGE HAVING A SEALING SILICONE GEL WITH SPHERICAL FILLERS

BACKGROUND OF THE INVENTION

1. Field of the Invention

The present invention relates to a resin-sealed semiconductor device in which a semiconductor element such as a flip-chip mounted on a hybrid substrate is sealed with a resin.

2. Description of Related Art

A conventional semiconductor chip is sealed with silicone gel or the like to insulate electrically and to protect the chip from environmental hazards such as water. A hybrid IC (Integrated Circuit) including, a flip-chip, for example, is electrically and mechanically connected with a conductor pattern formed on a thick layer circuit board through soldering bumps formed on a main surface of the flip-chip. The board is packed or sealed with silicone gel.

The silicone gel entering a space between the flip-chip and the board is thermally expanded and pushes up the flip-chip. U.S. Pat. No. 4,812,897 (corresponding to Japanese unexamined patent publication No. Showa 62-149157) suggests to soften the silicone gel in order to reduce the force pushing up the chip and to prevent breakage of the soldering bumps. Therefore, a silicone gel which has a low cross linking density has needed to be used.

A sealing resin needs to be filled with a filler which has a high thermal conductivity in order to reduce a generation of heat by the chip. However, since the silicone gel needs to be hardened in this case, it finally breaks the soldering bumps.

SUMMARY OF THE INVENTION

Accordingly, it is an object of the present invention to provide a resin-sealed semiconductor device sealed with a silicone gel having a good thermal conductivity and a low stress for a semiconductor element at the same time.

To accomplish the foregoing and other objects, the resin-sealed semiconductor device of the present invention includes a board, a semiconductor element and a sealing resin to seal the semiconductor element. The board has a conductor pattern formed thereon. The semiconductor element faces the board and is electrically bonded to the conductor pattern through a soldering bump having a predetermined height. The sealing resin has a silicone gel as a base resin and a spherical filler filled into the silicone gel. The diameter of the filler is equal to or shorter than the distance between the semiconductor element and the board. The relationship between a coefficient $\alpha$ of linear expansion and a complex modulus of elasticity $G^*$ of the sealing resin is defined as follows: $\alpha \leq 0.033 (G^* - 451)^{-0.56}$.

Since the silicone gel is filled with the spherical fillers, thermal conductivity of the sealing resin is improved. Moreover, since the relationship between $\alpha$ and $G^*$ is defined by the above-mentioned formula, a force pushing up the semiconductor element is reduced.

BRIEF DESCRIPTION OF THE DRAWINGS

The features of the present invention that are believed to be novel are set forth with particularity in the appended claims. The invention, together with the objects and advantages thereof, may best be understood by reference to the following description of the presently preferred embodiments together with the accompanying drawings in which:

DESCRIPTION OF THE PREFERRED EMBODIMENT

The preferred embodiment of the present invention is now described with reference to the drawings.

Figure 1:
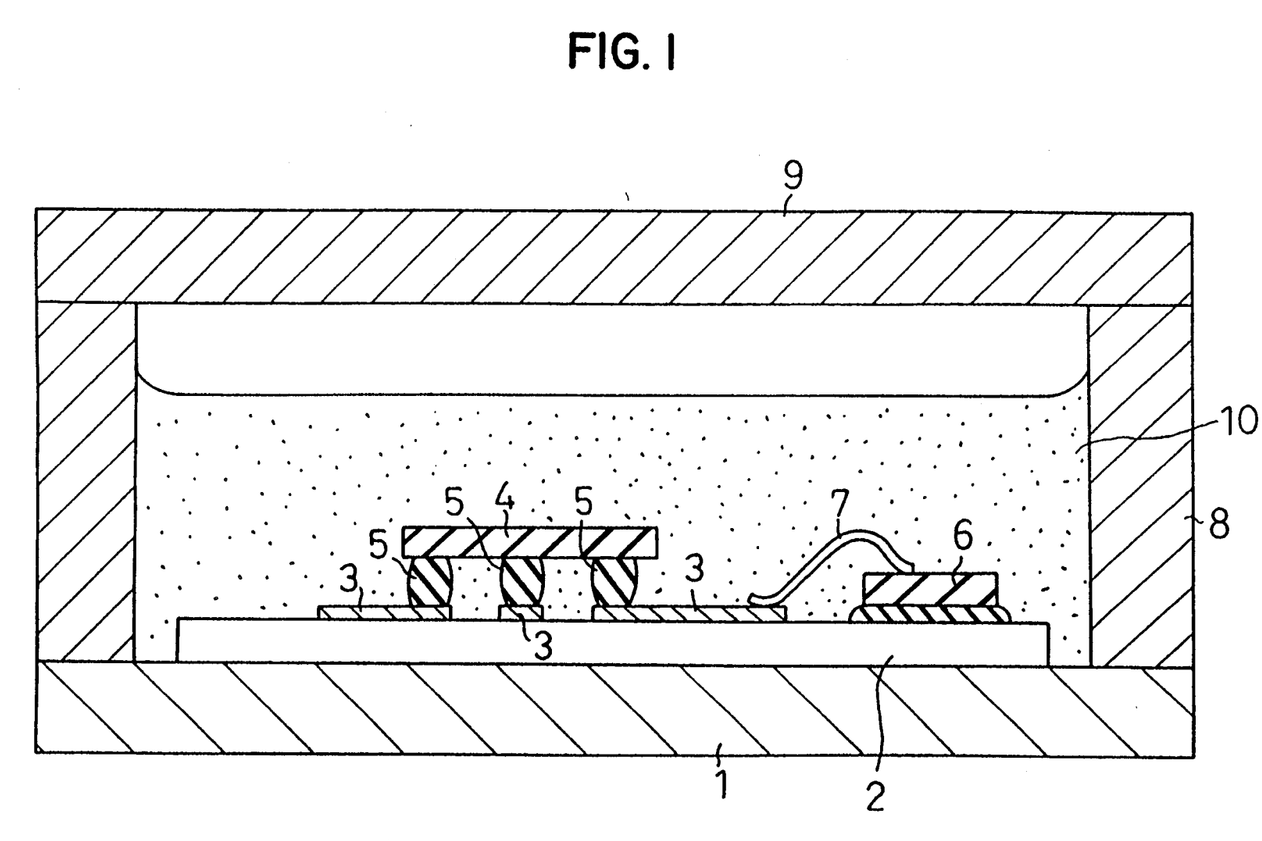
FIG. 1 is a cross-sectional view of an embodiment of a resin-sealed semiconductor device according to the present invention.

FIG. 1 shows a general structure of an automotive hybrid IC according to the present embodiment.

A heat sink 1 is made of metal. A thick layer circuit board 2 made of alumina is installed on the heat sink 1. Predetermined conductor patterns 3 are formed on the board 2. A flip-chip IC 4 made of silicon is soldered to the conductor patterns 3. Namely, soldering bumps 5 are formed on a main surface of the flip-chip IC 4, and the flip-chip IC 4 faces the board 2 through the soldering bumps 5. A power transistor 6 is also formed on the board 2. The power transistor 6 is electrically connected with the conductor pattern 3 through a wire 7. A case 8 circumferentially bonds to an upper surface of the heat sink 1. A cap 9 closes an upper opening of the case 8. The case 8 and the cap 9 are made of metal or resin. A sealing resin 10 fills in the case 8 to seal the board 2, the flip-chip IC 4 and the power transistor 6.

This structure of the hybrid IC generally suffers repeated temperature cycles due to ambient temperature changes and the self generation of heat, and the strain caused by the repeated thermal stresses affects the flip-chip IC 4.

Figure 2:
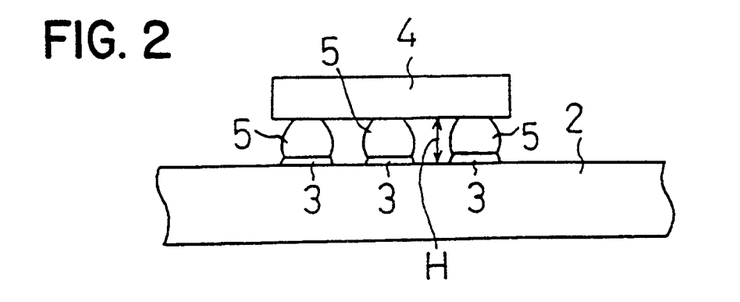
FIGS. 2, 3 and 4 are schematical side views of the semiconductor device shown in FIG. 1, for explaining shearing strain and tensile strain produced by thermal stress in a portion of an IC chip and bumps.
Figure 3:
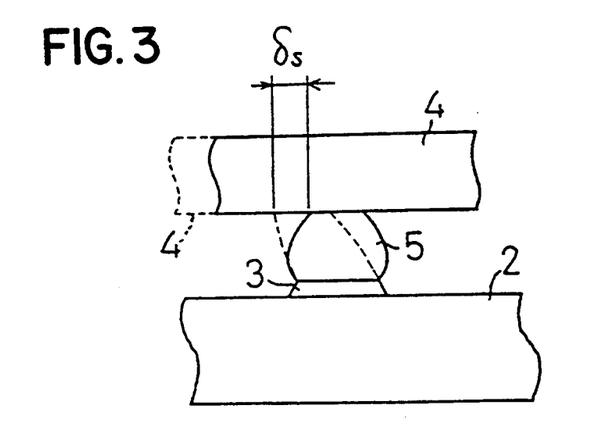

The thermal strain is now explained in detail with reference to FIGS. 2–4. The thermal strain comprises shear strain $\delta s$ shown in FIG. 3 and tensile strain $\delta E$ shown in FIG. 4. A thermal expansion coefficient of silicon is 4 ppm/°C. A thermal expansion coefficient of alumina is 7 ppm/°C. The shear strain $\delta s$ is produced by a difference between the thermal expansion coefficients of the flip-chip IC 4 and the board 2. The tensile strain $\delta E$ is produced by the thermal expansion of the sealing resin 10 inserted in a gap H having the height of the soldering bumps 5. The tensile strain $\delta E$ pushes up the flip-chip IC 4. The shear strain $\delta s$ and the tensile strain $\delta E$ increase with any increase of the chip size of the flip-chip IC.

The tensile strain δE affects breakage of the soldering bumps 5 more than the shear strain δs in a sealing structure in the prior art. Therefore, the first mode of breakage of the soldering bumps occurs due to pushing-up the flip-chip IC 4 by thermal expansion of the sealing resin 10 which is directly below the flip-chip IC 4. It is desirable that the force from the sealing resin 10 pushing up the flip-chip IC 4 is reduced in such a way that breakage due to the shear strain δs appears prior to breakage due to the tensile strain δE. In this case, enlargement of the flip-chip IC 4 and extension of the thermal fatigue life of the soldering bumps 5 due to repeated temperature cycles can be attained, and as a result, higher and more varied functions can be attained in a single chip. The reliability of the whole device involving the sealing structure can also be increased.

Figure 4:
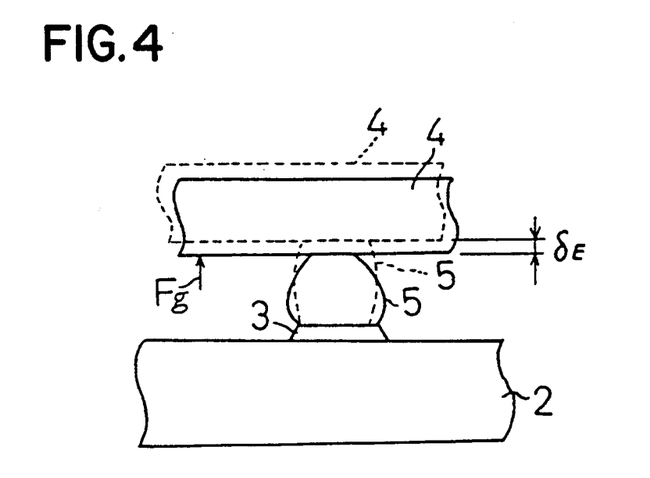

The force Fg pushing up the flip-chip IC 4 shown in FIG. 4 is represented by the following formula (1), which is derived from a theoretical visco-elasticity analysis in which flow, deformation and the like of various elastic viscous materials are analyzed:

$$Fg = f(G^* \cdot S \cdot \Delta T \cdot \alpha \cdot H)$$
$$= a(G^* - b)^c \cdot S^d \cdot \Delta T \cdot \alpha \cdot H^e \quad (1)$$

wherein $G^*$ denotes the complex modulus of elasticity of the sealing resin 10; S the area of the flip-chip IC 4; $\Delta T$ the width of temperature change around the flip-chip IC 4; $\alpha$ the coefficient of linear expansion of the sealing resin 10; H the distance between the flip-chip IC 4 and the board 2; and a, b, c, d and e are constants.

This formula shows that the pushing up force Fg can be calculated if $G^*$ representing the hardness of the sealing resin 10, i.e., the complex modulus of elasticity $G^*$ and the coefficient $\alpha$ of linear expansion are determined.

The pushing up force Fg must be equal to or larger than a pushing up force $F_{IC}$ as represented by the following formula (2), wherein the flip-chip IC 4 must be able to withstand $F_{IC}$ without breakage.

$$F_{IC} \geq Fg = a(G^* - b)^c \cdot S^d \cdot \Delta T \cdot \alpha \cdot H^e \quad (2)$$

The relationship between the complex modulus of elasticity $G^*$ and the coefficient $\alpha$ of linear expansion is easy to understand by transforming the formula (2) into the following formula (3).

$$\alpha \leq F_{IC} \cdot (a(G^* - b)^c \cdot S^d \cdot T \cdot H^e)^{-1} \quad (3)$$

Here, if the sealing resin 10 is not used and air is present between the flip-chip IC 4 and the board 2, the maximum size of the flip-chip IC 4 which may be used, considering breakage thereof due to the tensile strain δE, is usually assumed to be 7 to 9 mm□. Thus, the size of the flip-chip IC 4 is assumed to be 7 mm□ as the worst case. Moreover, although the force $F_{IC}$ is determined in accordance with the number, shape, material, position or the like of the soldering bumps 5, these factors should usually be designed in a limited range and thus should be considered as a constant parameter. The range of temperature change, $\Delta T$ max, of an automotive IC may be as high as 200° C.

The formula (3) can be reduced to the following formula (4), when a hypotheszed factor, such as a boundary condition, is treated as a correction constant. The correction constant was experimentally sought by experimenting with some appropriate IC chips.

$$\alpha \leq 0.033(G^* - 451)^{-0.56} \quad (4)$$

wherein the unit of the complex modulus of elasticity $G^*$ is dyn/cm$^2$, at 1Hz, 30° C.

Figure 5:
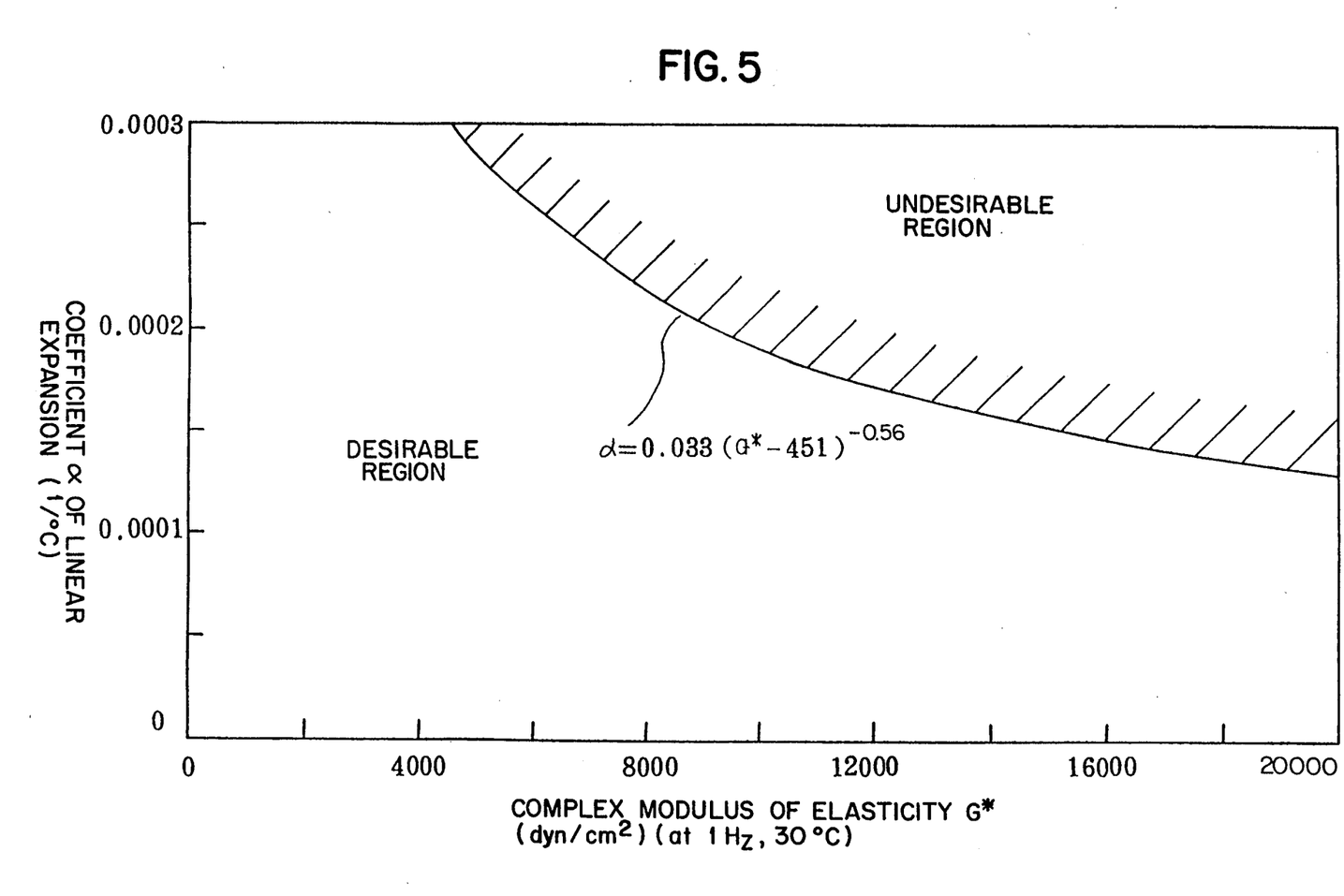
FIG. 5 shows the relationship between the complex modulus of elasticity and a coefficient of linear expansion.

Therefore, the relationship between $G^*$ and $\alpha$ needs to meet the requirement of the formula (4) to reduce sufficiently the pushing up force Fg. FIG. 5 shows the relationship.

It is desirable to fill the sealing resin 10 with fillers having a high thermal conductivity in order to improve the thermal conductivity of the sealing resin 10. Silica, alumina, silicon carbide, silicon nitride, aluminum nitride, magnesia and diamond are respectively suitable for such a filler. The base resin of the sealing resin 10 according to the present embodiment is an additional reaction-type silicone gel. Spherical alumina fillers are filled into the silicone gel. Alumina does not have a hydrolysis characteristic, keeps a high reliability for a long time, and has a low cost. A maximum diameter of the spherical alumina filler is equal to or shorter than the distance H between the flip-chip IC 4 and the board 2.

FIGS. 6–9 show characteristics of crushed alumina fillers and spherical alumina fillers, wherein both alumina fillers are filled into an additional reaction type silicone gel which has the complex modulus of elasticity $G^*$ of 1200 dyn/cm$^2$. A maximum diameter of the crushed alumina fillers is 20 μm, and average diameter of them is 5 μm. A maximum diameter of the spherical alumina fillers is 50 μm, and average diameter of them is 10 μm. A ratio of the major axis to the minor axis of the spherical alumina filler is 1:1. White circles are data points on a graph for crushed alumina fillers and black circles are data points on a graph for spherical alumina fillers in FIGS. 6–9.

Figure 6:
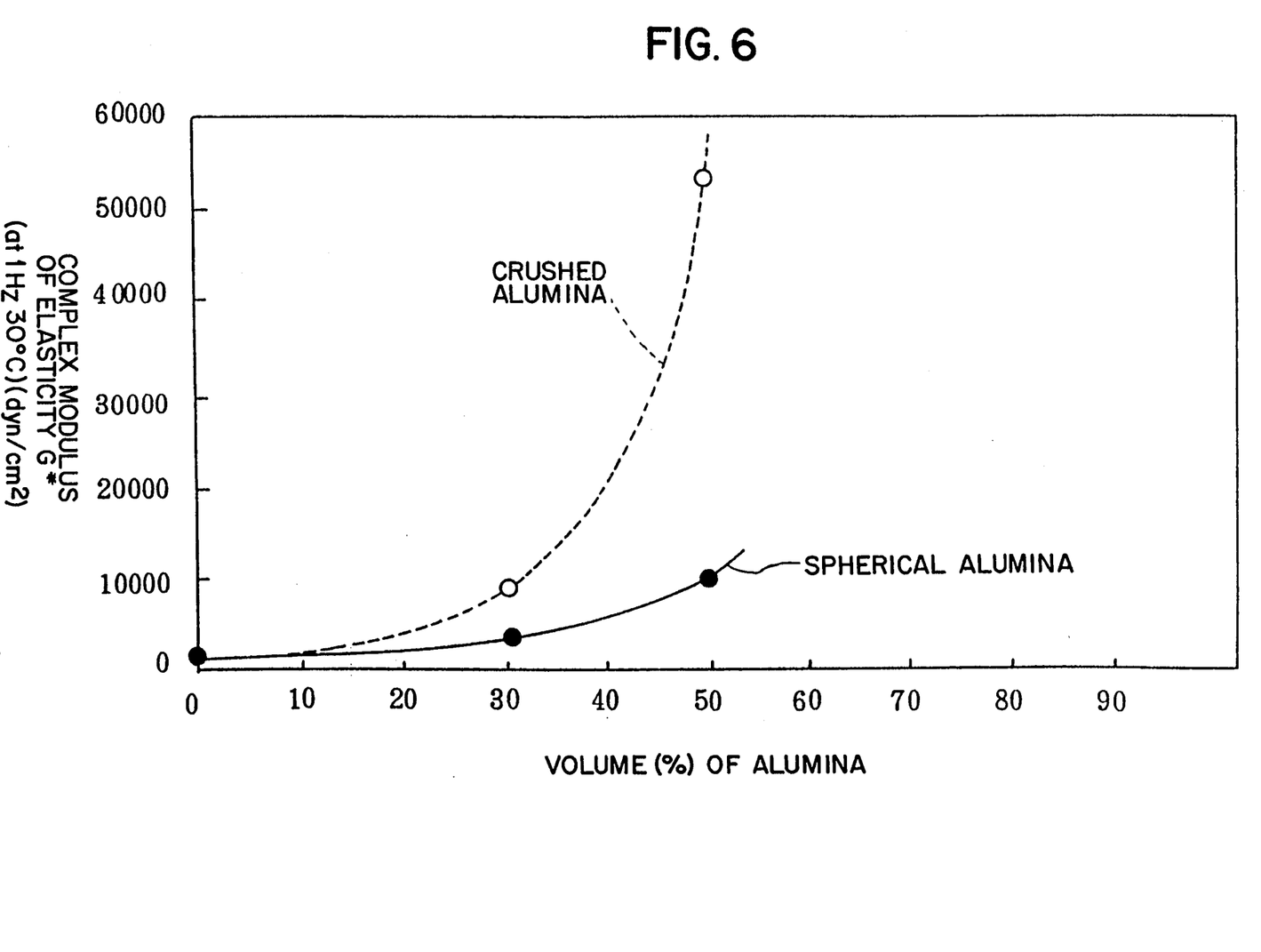
FIG. 6 shows the relationship between the volume percentage of alumina and the complex modulus of elasticity.
Figure 9:
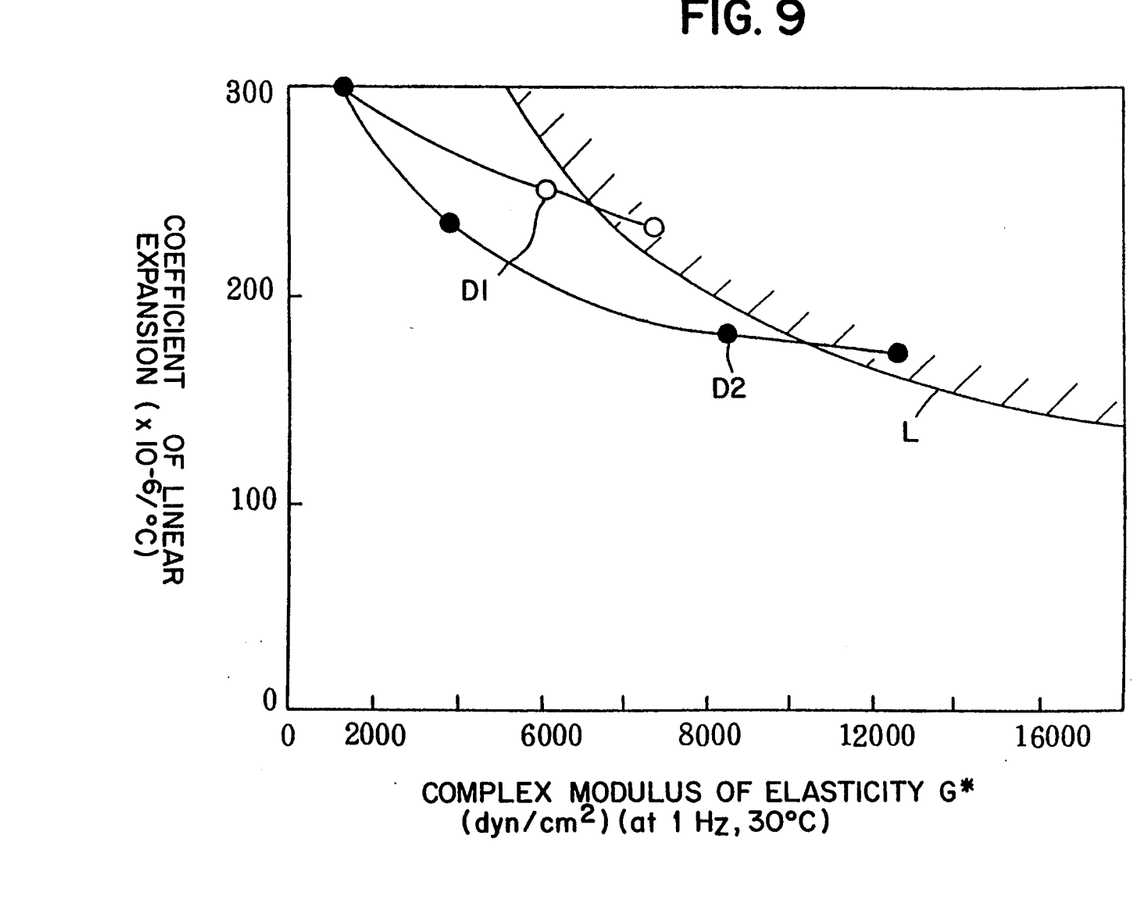
FIG. 9 shows the relationship between the complex modulus of elasticity and the coefficient linear expansion.

As a quantity, i.e., volume percentage of the crushed alumina fillers is raised to improve the thermal conductivity of the silicone gel, as shown in FIG. 6, the complex modulus of elasticity $G^*$ of the silicone gel is rapidly raised. Therefore, as shown in FIG. 9, when the thermal conductivity is higher than $0.9 \times 10^{-3}$ cal/cm.sec. °C., the silicone gel does not meet the requirement of the above-mentioned formula (4). The data point D1 marks a point where the crushed alumina filler has a thermal conductivity of $0.9 \times 10^{-3}$ cal/cm.sec. °C. and line L shows $\alpha = 0.033(G^* 451)^{-0.56}$. Above line L is an undesirable region and below it is a desirable region.

Figure 7:
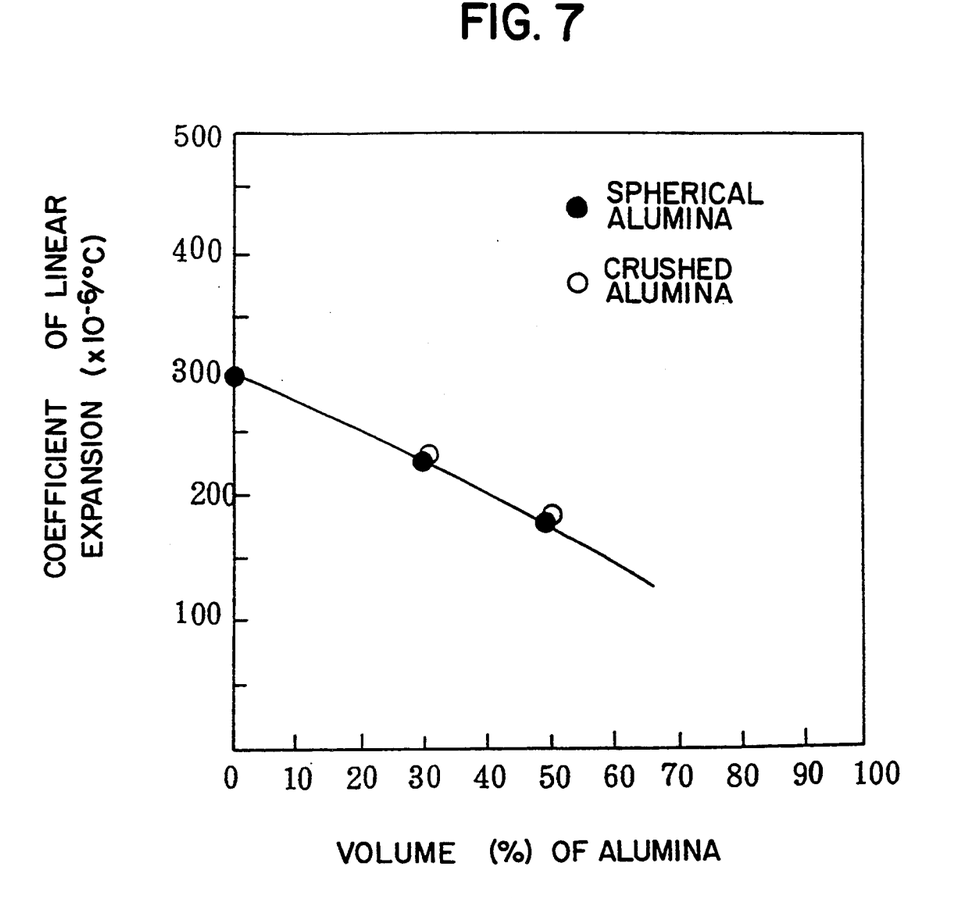
FIG. 7 shows the relationship between the volume percentage of alumina and the coefficient of linear expansion.
Figure 8:
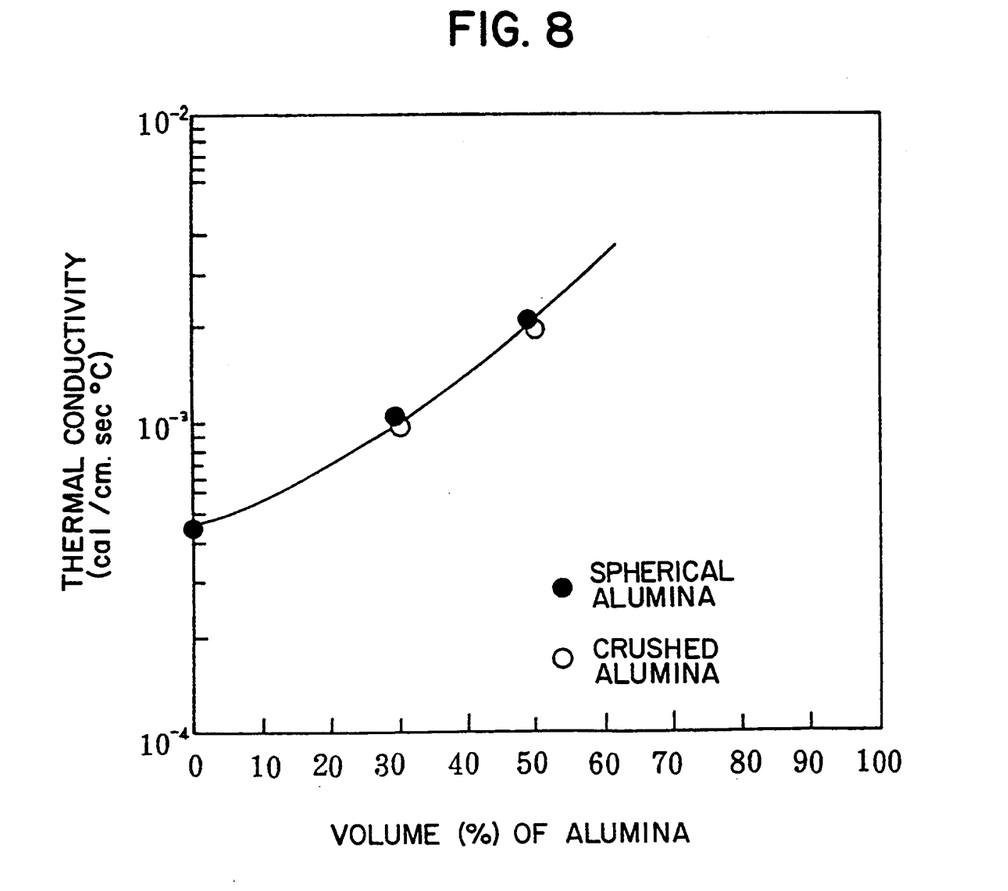
FIG. 8 shows the relationship between the volume percentage of alumina and a thermal conductivity.

On the other hand, as volume percentage of the spherical alumina fillers is raised, the complex modulus of elasticity $G^*$ of the silicone gel is relatively slowly raised. Therefore, as shown in FIG. 9, the silicone gel meets the requirement of the formula (4) until its thermal conductivity exceeds sufficiently high thermal conductivity (=higher than $2.5 \times 10^{-3}$ cal/cm.sec. °C.) the data point D2 shows the spherical alumina filler having the thermal conductivity of $2.5 \times 10^{-3}$ cal/cm.sec. °C. The reason is that, as shown in FIGS. 7 and 8, although the coefficient $\alpha$ of linear expansion and the thermal conductivity are affected only by the volume percentage of the alumina fillers without an influence of shape of them as shown in FIG. 6, the complex modulus of elasticity $G^*$ is fairly affected by the volume percentage and the shape of the alumina fillers.

It is noted that, if the maximum diameter of the filler is longer than the distance H between the flip-chip IC 4 and the board 2 it is impossible to sufficiently improve the thermal conductivity.

Figure 10:
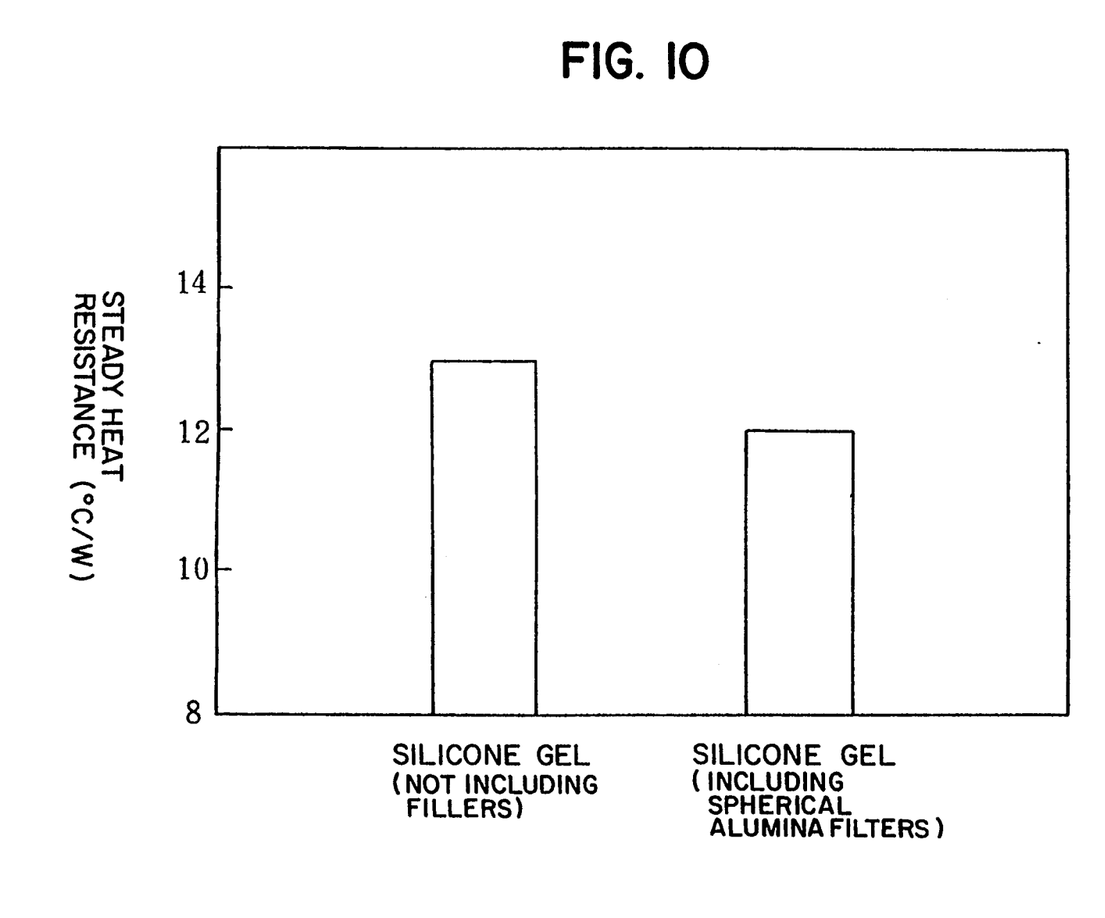
FIG. 10 shows the relationship between kinds of sealing resin and a steady head resistance.

FIG. 10 shows a steady heat resistance of the power transistor 6, shown in FIG. 1, which is sealed with the sealing resin 10 having the thermal conductivity of approximately $2.5 \times 10^{-3}$ cal/cm.sec. °C. The heat resistance of the sealing resin 10 according to the present embodiment, i.e., the silicone gel including the spherical alumina fillers is lower than that of the silicone gel not including such fillers.

As mentioned above, according to the present embodiment, since the silicone gel as the sealing resin 10 is filled with the spherical alumina fillers, the thermal conductivity of the sealing resin 10 is improved; therefore, the heat generated from the power transistor 6 is promptly released. Moreover, since the spherical alumina fillers are filled into the silicone gel in such a way that the relationship between G* and α of the sealing resin 10 meets the requirement of the formula (4), the pushing up force Fg due to the tensile strain δE is reduced. Consequently, the sealing resin 10 has a good thermal conductivity and a low stress for the flip-chip IC 4 at the same time.

The present invention has been described with reference to the above-mentioned embodiment, but the present invention is not limited to this embodiment and can be modified without departing from the spirit or concept of the present invention.

For example, spherical fillers having high thermal conductivity, such as aluminum nitride, or crystal silica are also suitable for the above-mentioned sealing resin 10.

What is claimed is:

1. A resin-sealed semiconductor device comprising:
a board having a conductor pattern formed thereon;
a semiconductor element including at least one soldering bump having a predetermined height facing said board and electrically bonded to said conductor pattern through said soldering bump; and
a sealing resin entering a space between said semiconductor element and said board and sealing said semiconductor element;
wherein said sealing resin includes
a silicone gel as a base resin; and
a spherical filler filled into said silicone gel, a diameter of said filler being at most a distance between said semiconductor element and said board, and volume percentage of said filler in said silicone gel being adjusted in such a way that a relationship between a coefficient α of linear expansion of said sealing resin and complex modulus of elasticity G* (dyn/cm², at $1H_z$, 30° C.) of said sealing resin meets retirement of following formula:

$$\alpha \leq 0.033(G^* - 451)^{-0.56}.$$

2. A resin-sealed semiconductor device according to claim 1, wherein said semiconductor device is a flip-chip IC.

3. A resin-sealed semiconductor device according to claim 1, wherein said silicone gel is of an additional reaction type.

4. A resin-sealed semiconductor device according to claim 1, wherein thermal conductivity of said filler is higher than thermal conductivity of said silicone gel.

5. A resin-sealed semiconductor device according to claim 4, wherein said filler is made of at lease one of alumina, aluminum nitride and crystal silica.

6. A resin-sealed semiconductor device according to claim 5, wherein said filler is made of alumina.

7. A resin-sealed semiconductor device according to claim 1, wherein said device is used under a condition of a temperature change width up to 200° C.

* * * * *